(12) United States Patent
Cheng et al.

(10) Patent No.: US 11,791,342 B2
(45) Date of Patent: Oct. 17, 2023

(54) VARACTOR INTEGRATED WITH COMPLEMENTARY METAL-OXIDE SEMICONDUCTOR DEVICES

(71) Applicant: International Business Machines Corporation, Armonk, NY (US)

(72) Inventors: Kangguo Cheng, Schenectady, NY (US); Julien Frougier, Albany, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 17/528,391

(22) Filed: Nov. 17, 2021

(65) Prior Publication Data
US 2023/0154925 A1     May 18, 2023

(51) Int. Cl.
| H01L 27/12 | (2006.01) |
| H01L 21/84 | (2006.01) |
| H01L 29/423 | (2006.01) |
| H01L 29/786 | (2006.01) |

(52) U.S. Cl.
CPC ......... *H01L 27/1203* (2013.01); *H01L 21/84* (2013.01); *H01L 29/42392* (2013.01); *H01L 29/78696* (2013.01)

(58) Field of Classification Search
CPC .............. H01L 21/84; H01L 27/10876; H01L 29/66545; H01L 27/0105
USPC .......................................... 257/312; 438/379
See application file for complete search history.

(56) References Cited

U.S. PATENT DOCUMENTS

| 5,278,444 | A  | 1/1994  | Lieneweg  |
| 6,759,904 | B2 | 7/2004  | Behzad    |
| 7,235,862 | B2 | 6/2007  | Bulucea   |
| 9,071,244 | B2 | 6/2015  | Poulton   |
| 9,136,061 | B2 | 9/2015  | Tesson    |
| 9,502,586 | B1 | 11/2016 | Kim       |
| 10,181,381 | B2 | 1/2019 | Al-Hazmi  |
| 10,243,002 | B2 | 3/2019 | Leobandung |
| 10,460,788 | B2 | 10/2019 | Müller    |
| 10,522,664 | B2 | 12/2019 | Byun      |
| 10,535,784 | B2 | 1/2020 | Wright    |
| 10,600,881 | B2 | 3/2020 | Yang      |
| 2013/0313683 | A1 | 11/2013 | Gunawan |

(Continued)

FOREIGN PATENT DOCUMENTS

| EP | 2693478 B1   | 5/2019 |
| KR | 101838910 B1 | 4/2018 |

OTHER PUBLICATIONS

Shim et al., "Symmetric Varactor in 130-nm CMOS for Frequency Multiplier Applications," in IEEE Electron Device Letters, vol. 32, No. 4, pp. 470-472, Apr. 2011, doi: 10.1109/LED.2011.2108994.

(Continued)

*Primary Examiner* — Thinh T Nguyen
(74) *Attorney, Agent, or Firm* — David K. Mattheis (57) ABSTRACT

A semiconductor FET (field effect transistor) including a plurality of nanosheet channels disposed between a first source/drain region and a second source/drain region and a common metal contact for the first source/drain region and the second source/drain region. The first source/drain region includes a p-type material; and the second source/drain region includes an n-type material.

7 Claims, 8 Drawing Sheets

(56) References Cited

U.S. PATENT DOCUMENTS

| | | |
|---|---|---|
| 2015/0036542 A1 | 2/2015 | Xia |
| 2020/0041151 A1 | 2/2020 | Fulford |
| 2020/0357895 A1* | 11/2020 | Cheng et al. ....... H01L 29/6656 438/234 |
| 2020/0411518 A1 | 12/2020 | Fulford |

OTHER PUBLICATIONS

List of IBM Patents or Patent Applications Treated as Related, filed herewith, pp. 1-2.
U.S. Appl. No. 17/528,279, filed Nov. 17, 2021.

* cited by examiner

VARACTOR INTEGRATED WITH COMPLEMENTARY METAL-OXIDE SEMICONDUCTOR DEVICES

BACKGROUND

The disclosure relates generally to semiconductor varactor devices. The disclosure relates particularly to semiconductor varactor devices integrated with complementary metal-oxide semiconductor (CMOS) field effect transistor (FET) devices.

System on chip designs may include varactors—capacitors with capacitance which varies according to an applied bias voltage. Varactors may be formed using CMOS processes. An n-type FET (NFET) may be used as a varactor where a common contact for the source/drain regions serves as one device contact and the gate contact serves as the other device contact. Such an NFET based varactor serves well for positive bias voltages applied to the gate contact but does not function well for negative gate voltages. Conversely, a p-type FET (PFET) serves well for negative gate voltages but not for positive gate voltages.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor FET (field effect transistor) includes a plurality of nanosheet channels disposed between a first source/drain region and a second source/drain region. The first source/drain region includes a p-type material; and the second source/drain region includes an n-type material. The first source/drain region and the second source/drain region share a common electrical contact.

In one aspect, a method of fabricating a semiconductor device includes forming a stack of nanosheet channels upon a substrate, forming a gate structure adjacent to the nanosheet channels, forming a p-type source/drain region adjacent to one side of the gate structure, forming an n-type source/drain region adjacent to an opposing side of the gate structure, and forming a common electrical contact for the first source/drain region and the second source/drain region.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Disclosed embodiments provide structures and associated fabrication methods yielding nanosheet varactors by epitaxially forming a p-type source region on one side of the device channel, and epitaxially forming an n-type drain region on the other side of the channel. In an embodiment, the device further includes at least one FET, either an n-type FET (NFET), or a p-type FET (PFET). In an embodiment, the device includes each of an NFET and a PFET, formed concurrently with the varactor. In an embodiment, the device includes the varactor, and a tunnel FET, (TFET) formed concurrently. In this embodiment, the device may include additional FETs, NFET, NFET or TFET.

Reference is now made to the figures. The figures provide schematic cross-sectional illustration of semiconductor devices at intermediate stages of fabrication, according to one or more embodiments of the invention. The figures provide a cross-section view of the device during the illustrated stages of fabrication. The figures provide schematic representations of the devices of the invention and are not to be considered accurate or limiting with regards to device element scale.

Figure 1:
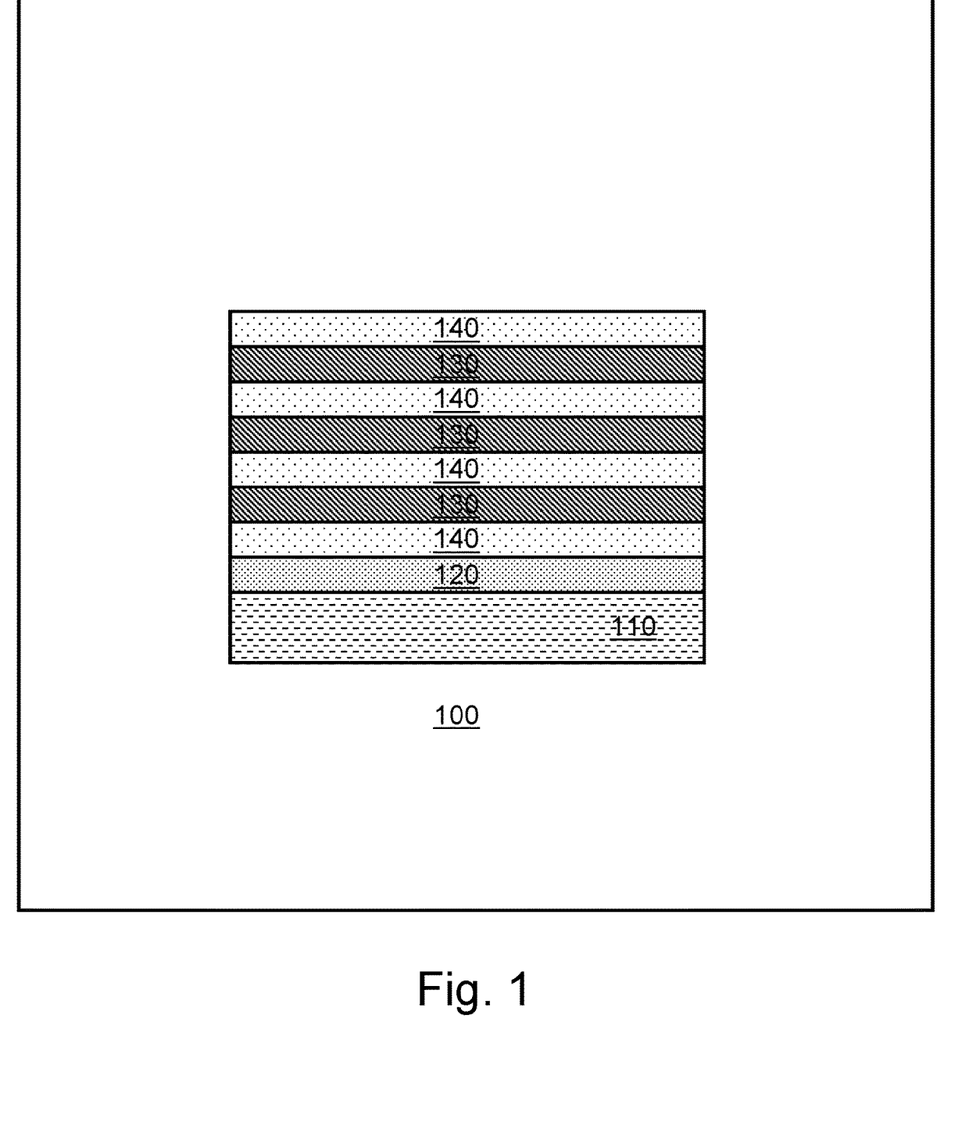
FIG. 1 provides a cross-sectional view of a step in the fabrication of a semiconductor device, according to an embodiment of the invention. The figure illustrates a formed stack of semiconductor nanosheets upon an underlying substrate.

FIG. 1 provides a schematic view of a device 100 according to an embodiment of the invention following the deposition of a stack of layers for the formation of FET device nanosheets. In an embodiment, the stack includes alternating layers of epitaxially grown silicon germanium 140, 120, and silicon 130. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer of a first semiconductor material, such as Si and alternating layers of a second semiconductor material, such as SiGe. The nanosheet stack is depicted with eight layers (four SiGe layers and three Si layers forming a device, and a single high Ge concertation, e.g., 40%-70% Ge, SiGe layer 120, separating the device stack from the underlying semiconductor substrate 110. However, any number and combination of layers can be used so long as the layers alternate between SiGe and Si to form a device and include a high Ge concentration SiGe layer separating the device from the substrate. The nanosheet stack is depicted with the layers being in the form of nanosheets, however the width of any given nanosheet layer can be varied so as to result in the form of a nanowire, a nanowire, etc. SiGe layers 140, 120, can be composed of, for instance, $SiGe_{15-35}$, examples thereof including, but not limited to $SiGe_{15}$, $SiGe_{20}$, $SiGe_{25}$ ... $SiGe_{35}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In an embodiment, each sacrificial semiconductor material layer 140 and 120, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 and 120 is composed of a silicon germanium alloy. In such an embodiment, the SiGe alloy that provides each sacrificial semiconductor material layer 120 has a germanium content that is greater than 45 atomic percent germanium. In one example, the SiGe alloy that provides each sacrificial semiconductor material layer 120 has a germanium content from 45 atomic percent germanium to 70 atomic percent germanium. In such an embodiment, the SiGe alloy that provides each sacrificial semiconductor material layer 140 has a germanium content that is less than 45 atomic percent germanium. In one example, the SiGe alloy that provides each sacrificial semiconductor material layer 140 has a germanium content from 15 atomic percent germanium to 35 atomic percent germanium. The first semiconductor material that provides each sacrificial semiconductor material layers 140 and 120 can be formed utilizing an epitaxial growth (or deposition process).

Each semiconductor channel material layer 130, is composed of a second semiconductor material that has a different etch rate than the first semiconductor material of the sacrificial semiconductor material layers 140 and 120 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 45 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, 120 is composed of a silicon germanium alloy. The second semiconductor material of each semiconductor channel material layer 130, can be formed utilizing an epitaxial growth (or deposition process).

Fabrication of device 100 proceeds with the patterning, masking and selective etching of the stack of nanosheet layers to form individual nanosheet fin stacks. In an embodiment, the stack includes alternating layers of epitaxially grown silicon germanium 140, 120, and silicon 130. Other materials having similar properties may be used in place of the SiGe and Si. In an embodiment, reactive ion etching recesses exposed nanosheet stack portions yielding the desired nanosheet stack fins.

In an embodiment, the etching proceeds into substrate 110. Deposition of a shallow trench isolation (STI) material, such as silicon dioxide, or any suitable combination of multiple dielectric materials (e.g., silicon nitride and silicon oxide), occurs after the formation of shallow trench isolation (STI) regions between nanosheet stack circuit elements of the device. Following such deposition, chemical mechanical planarization (CMP) processes smooth the upper surface of the deposited oxide in preparation for the subsequent fabrication steps. An oxide recess process trims the upper surface of STI regions to the level of the bottom semiconductor layer 130, and. STI regions provide electrical isolation between adjacent NS transistors.

Figure 2:
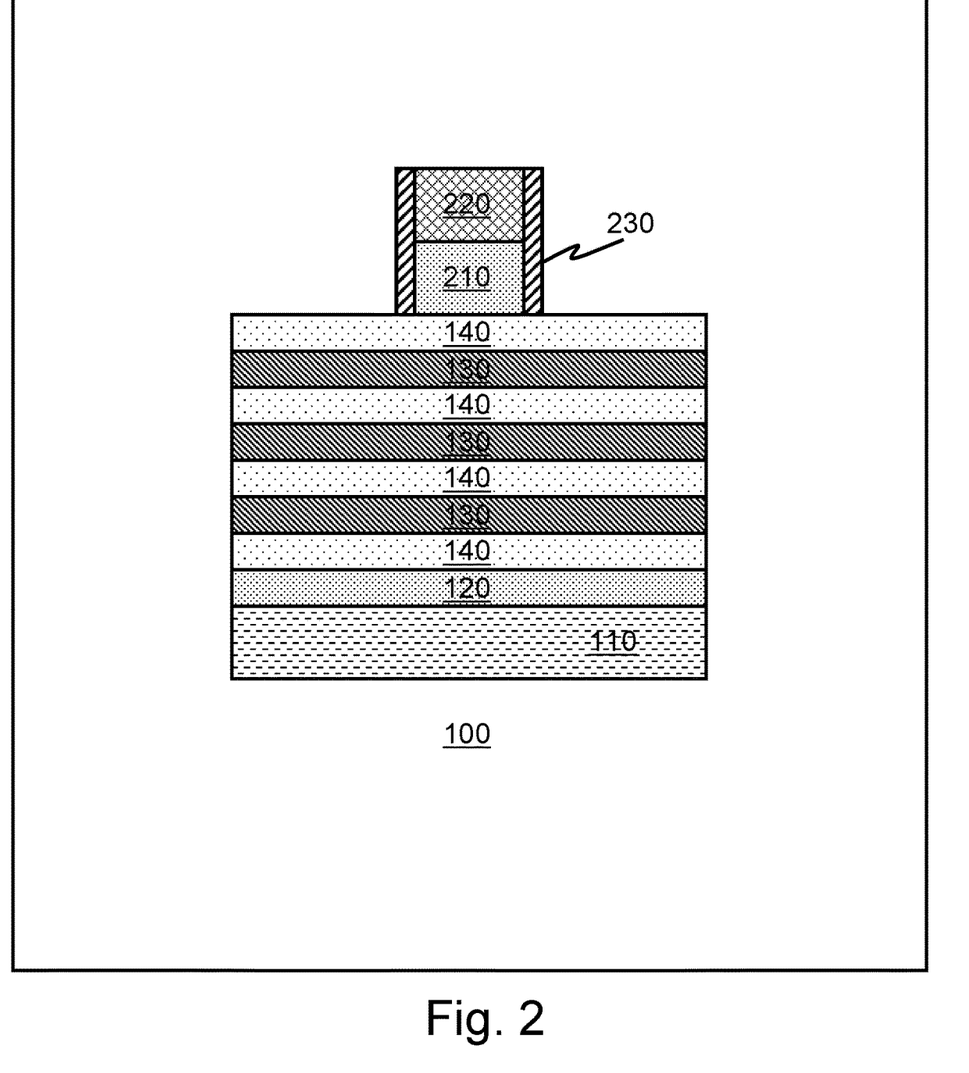
FIG. 2 provides a cross-sectional view of a step in the fabrication of a semiconductor device, according to an embodiment of the invention. The figure illustrates a dummy gate structure formed above the stacked nanosheets.

FIG. 2 illustrates device 100 following the forming of at least one dummy gate structure on the nanosheet stack. A single dummy gate is shown however any number of gates can be formed. Dummy gate structures can be formed by depositing a dummy gate material 210 over the nanosheet stack. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material 210 can be, for example, a thin layer of oxide, followed by polycrystalline silicon, amorphous silicon or microcrystal silicon. After that, a hardmask layer 220 is deposited over the dummy gate, followed by lithographic patterning and masking and selective etching processes.

Hard mask 220 includes a nitride, oxide, an oxide-nitride bilayer, or another suitable material. In some embodiments, the hardmask 220 may include an oxide such as silicon oxide (SiO), a nitride such as silicon nitride (SiN), an oxynitride such as silicon oxynitride (SiON), combinations thereof, etc. In some embodiments, the hardmask 220 is a silicon nitride such as $Si_3N_4$.

FIG. 2 further illustrates device 100 following the deposition and subsequent etching, such as anisotropic etching to remove material from horizontal surfaces, of gate sidewall spacers 230 adjacent to the vertical surfaces of dummy gate materials 210 and hardmask 220. In an embodiment, gate sidewall material 230, may be the same material as hardmask 220, or may be different materials and may be comprised of any one or more of a variety of different insulative materials, such as $Si_3N_4$, SiBCN, SiNC, SiN, SiCO, $SiO_2$, SiNOC, etc. In this embodiment, after conformal deposition, selective etching, such as anisotropic reactive ion etching, removes gate sidewall spacer material 230 from horizontal surfaces of the intermediate stage of the device 100.

Figure 3:
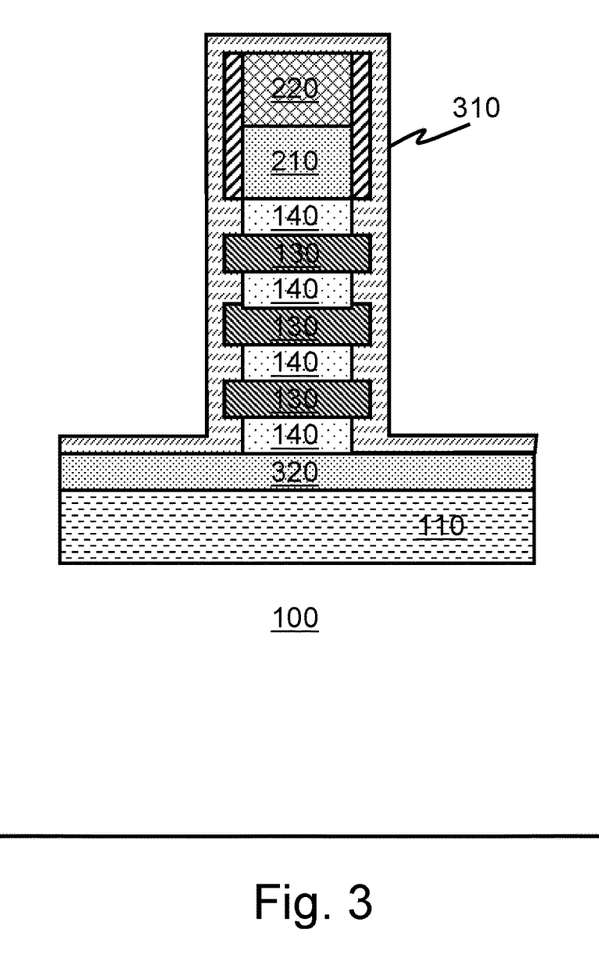
FIG. 3 provides a cross-sectional view of a step in the fabrication of a semiconductor device, according to an embodiment of the invention. The figure illustrates the device after the recessing of nanosheets, forming source/drain spaces, the formation of a bottom dielectric isolation layer beneath the nanosheets, and after the formation of inner spacers between otherwise adjacent nanosheets.

FIG. 3 illustrates device 100 following the selective masking and etching of nanosheets between dummy gate structures, and the formation of inner spacers between adjacent nanosheet channel layers 130, yielding individual gate structures. Selective anisotropic etching such as RIE removes portions of the alternating sacrificial layers 140 and channel layers 130 from between adjacent dummy gate structures. Protective gate sidewall spacers 330 prevent damage to the dummy gate structures. The nanosheet layer portions are removed to the upper surface of the lowest semiconductor layer 130.

FIG. 3 further illustrates device 100 following formation of inner spacers between nanosheets of the respective FET devices. Portions of nanosheet stack layers 130, and 140, which are not underneath gate sidewall spacers 330 and not underneath dummy gate 310 are removed. Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma or reactive gas. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

Figure 4:
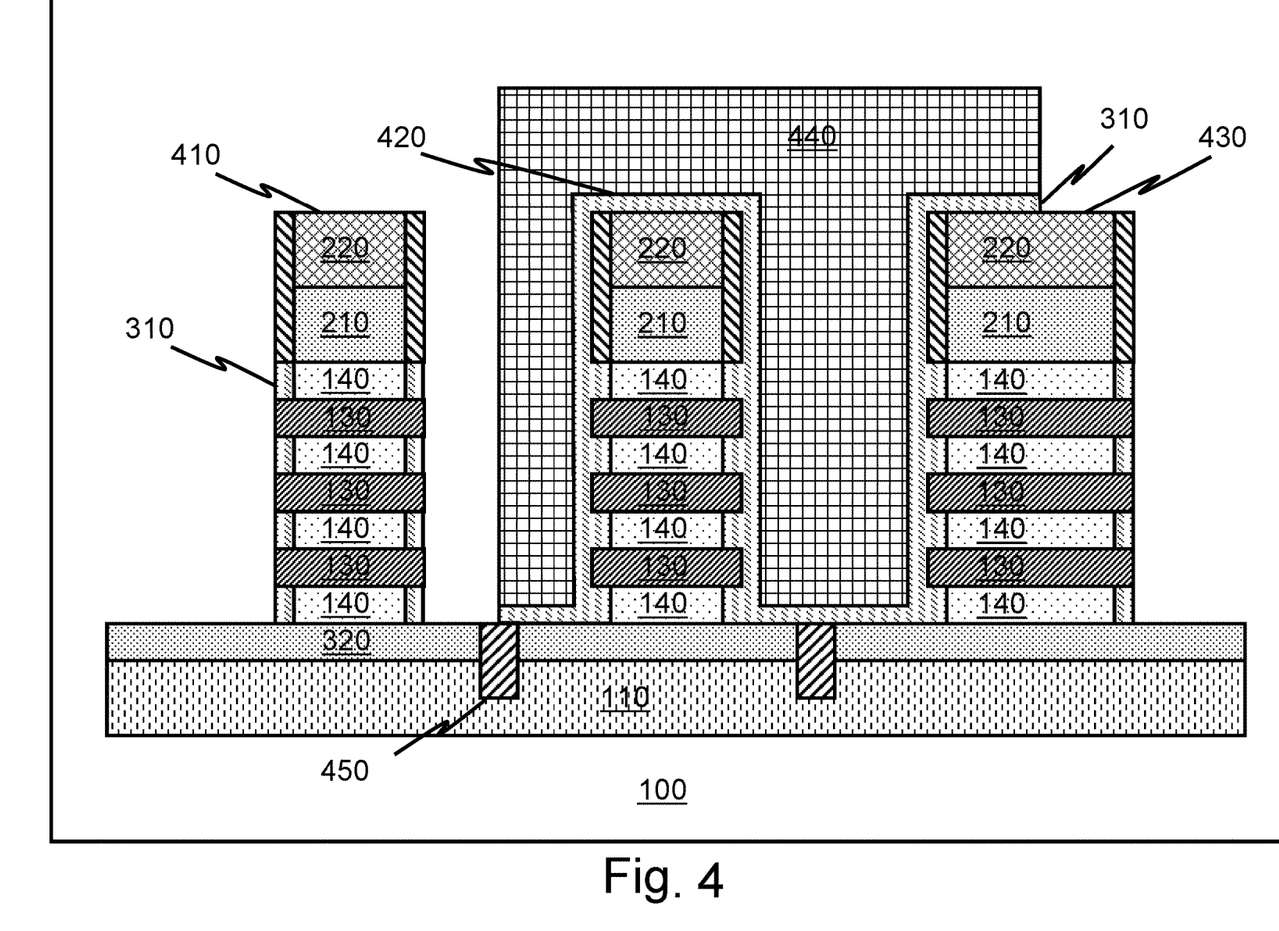
FIG. 4 provides a cross-sectional view of a step in the fabrication of a semiconductor device, according to an embodiment of the invention. The figure illustrates the device after the masking of one side of the varactor dummy gate structure and one FET dummy gate structure.

After generally etching the nanosheet stack, a selective etching of SiGe layers 140 of the nanosheet stack removes portions of the layers which are underneath gate sidewall spacers 320. Inner spacers are then formed in etched portions and thus are located under gate sidewall spacers 330. Inner spacers can be composed of any suitable dielectric material, for example $Si_3N_4$, SiBCN, SiNC, SiN, SiCO, $SiO_2$, SiNOC, etc. The inner spacer is formed from a conformal dielectric liner 310 deposition filling the cavities and generally coating all exposed device surfaces FIG. 4 illustrates device 100 including two FET dummy gate structures 410, 420, and a varactor dummy gate structure 430. It should be noted that the gate length of varactor 430 exceeds that of FET 410, and FET 420, minimizing lithography overlay issues in masking one side of varactor 430. The Figure further illustrates device 100 following formation of a protective mask layer 440, such as an organic planarization layer (OPL), upon the conformal dielectric liner 310, shielding one side of the varactor dummy gate 430 and FET dummy gate structure 420. In an embodiment, OPL shielding 440 masks one side of each of the varactor dummy gate structure 430 and the FET dummy gate structure 420. In this embodiment, subsequent fabrication steps forming device source/drain (S/D) regions yield the varactor and a TFET in addition to either a PFET or an NFET. In an embodiment, OPL 440 masks one side of each of FET structure 410, 420, and varactor 430. In an embodiment, subsequent fabrication yields two TFET devices in addition to the varactor. Selective etching of exposed dielectric liner 310 follows OPL deposition, revealing the edges of FET 410 and varactor 430 nanosheet 130 edges. FIG. 4 further illustrates STI region 450 formed between the FET and varactor dummy gate structures 410, 420, and 430.

Figure 5:
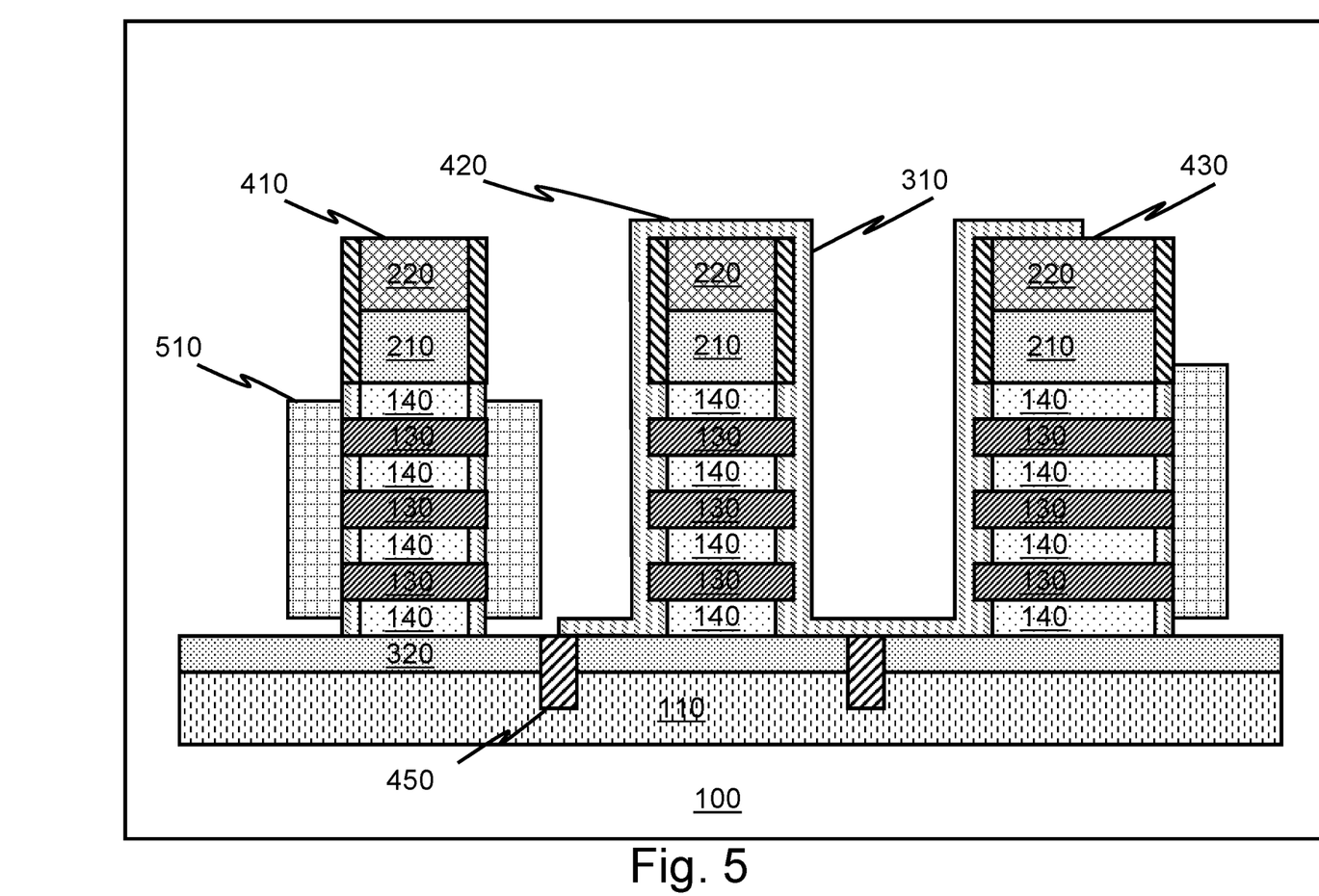
FIG. 5 provides a cross-sectional view of a step in the fabrication of a semiconductor device, according to an embodiment of the invention. The figure illustrates the device after the epitaxial growth of an n-type source drain region on the exposed nanosheet edges of the exposed side of the varactor and FET dummy gates.

FIG. 5 illustrates device 100 following epitaxial growth of a p-type source region from the exposed edges of the nanosheet layers 130. The terms "epitaxially growing and/or depositing" and "epitaxially grown and/or deposited" mean the growth of a semiconductor material on a deposition surface of a semiconductor material, in which the semiconductor material being grown has the same or similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or similar crystalline characteristics as the deposition surface on which it is formed.

In the present embodiments, the source-drain regions 510 may be doped in-situ by adding one or more dopant species to the epitaxial material. The dopant used will depend on the type of FET being formed, whether p-type or n-type. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. Exemplary n-type materials include Si:P, Si:As, Si:Sb, etc. FIG. 5 further illustrates the removal of OPL 440 through an ashing process, exposing protective dielectric liner 310. OPL 440, can be removed before epitaxy process. Epitaxy growth occurs only on exposed nanosheets while no epitaxial material grows on nanosheets covered by dielectric liner 310.

Following encapsulation of the n-type FET 410 and varactor n-type drain region with additional masking material such as OPL 440, selective etching removes protective dielectric liner 310 from FET dummy gate structure 420.

Figure 6:
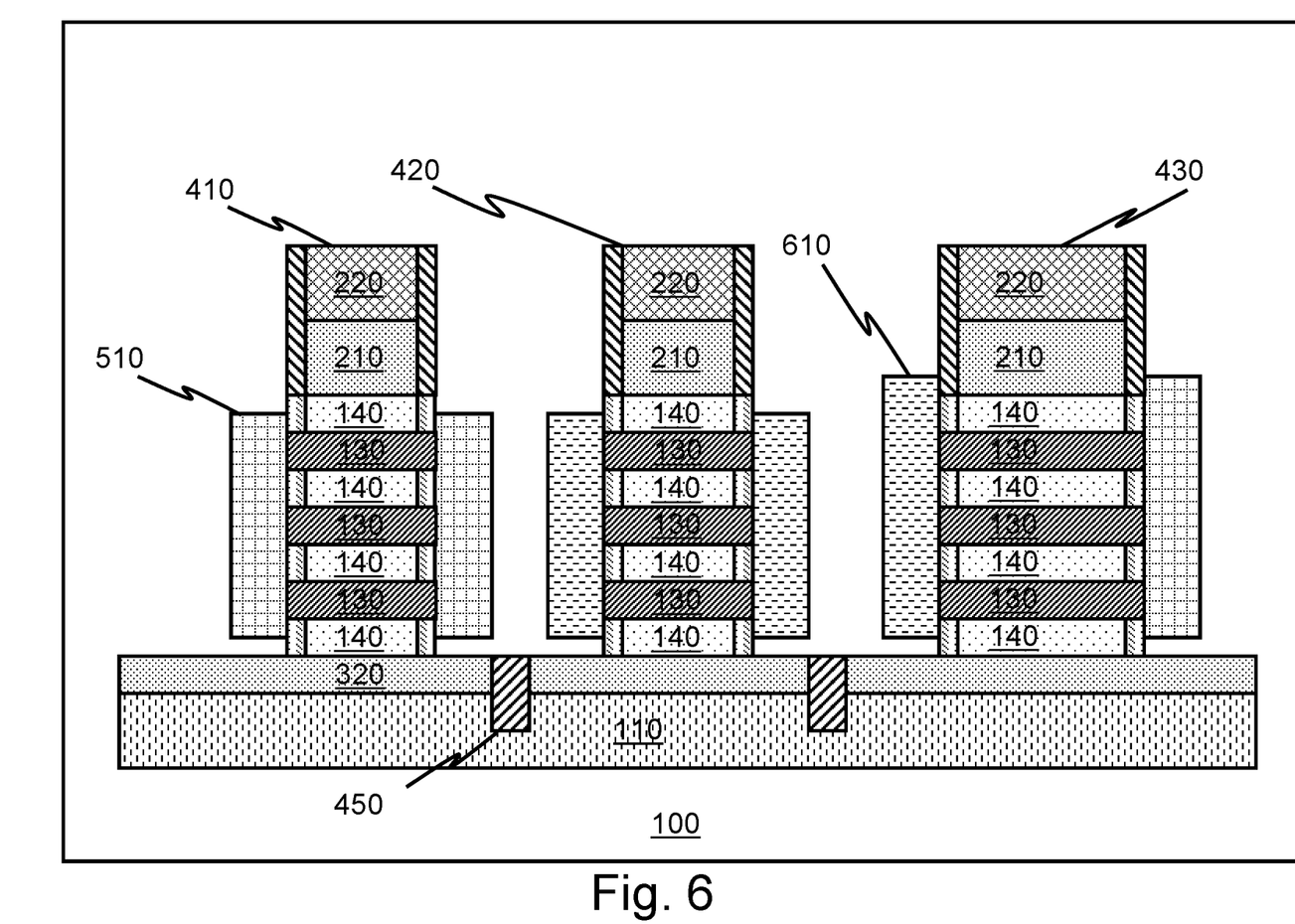
FIG. 6 provides a cross-sectional view of a step in the fabrication of a semiconductor device, according to an embodiment of the invention. The figure illustrates the device after the epitaxial growth of the p-type source drain regions upon the other side of the varactor dummy gate and the exposed nanosheet channels of the other FET.

FIG. 6 illustrates device 100 following epitaxial growth of the p-type drain region 610 adjacent to the edges of the nanosheet channels 130 of FET structure 420 and varactor 430, in a similar manner as that described above for n-type source 510. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. Exemplary p-type source materials include SiGe:B, SiGe:Ga, etc. In an embodiment, masking of the NFET stack 410, and the n-type S/D region of the varactor stack 430 follows deposition of a protective dielectric material over the exposed device surfaces. In this embodiment, epitaxial growth of the p-type S/D region follows selective removal of the protective dielectric layer from the surfaces of the PFET stack 420, and the side of the varactor stack 430 adjacent to the PFET stack 420. exposing the edges of the PFET and varactor nanosheet channel layers 130.

Figure 7:
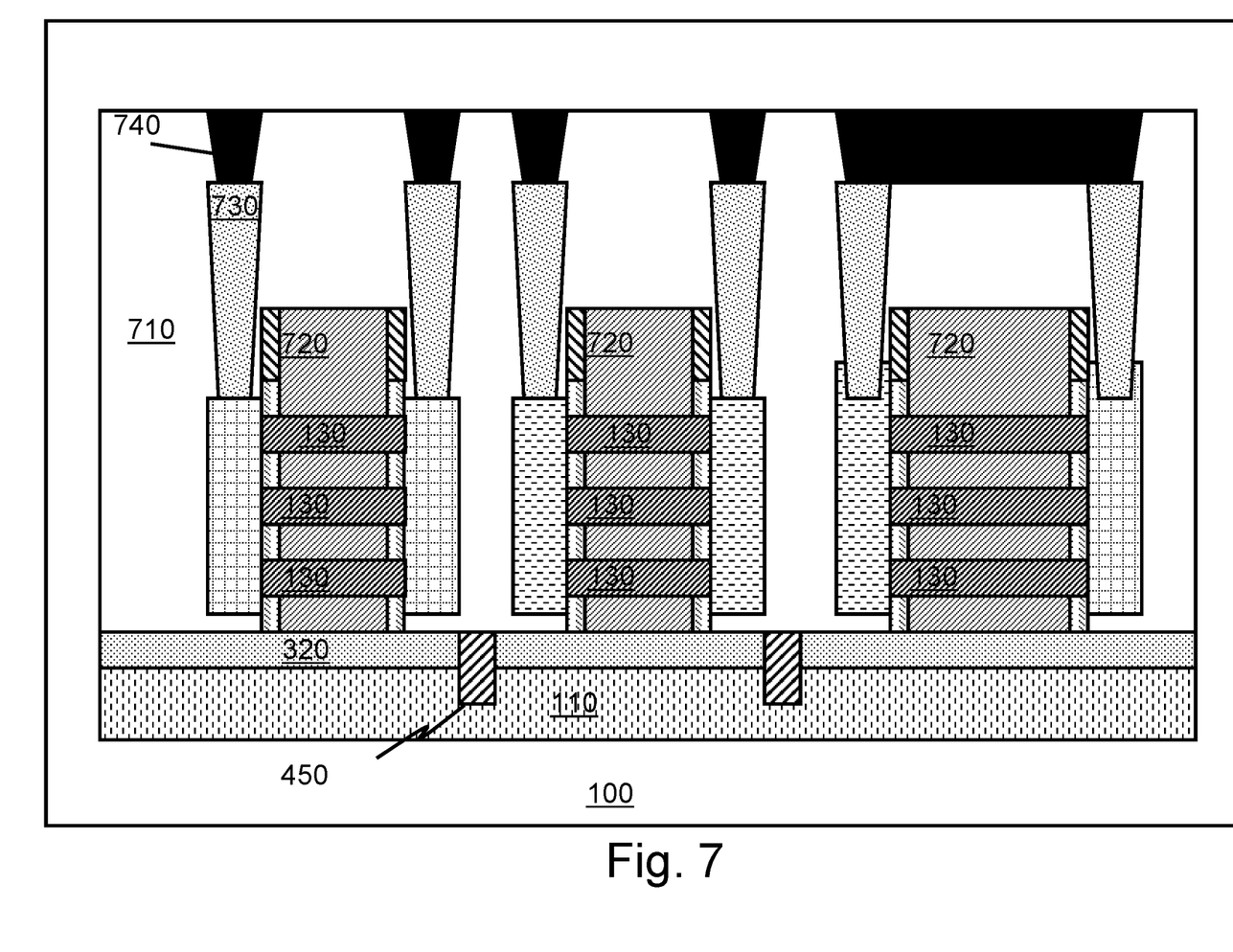
FIG. 7 provides a cross-sectional view of a step in the fabrication of a semiconductor device, according to an embodiment of the invention. The figure illustrates the device after encapsulation of the device by interlayer dielectric materials, the formation of a high-k metal gates in place of dummy gates, and the formation of upper device metal contacts.

FIG. 7 illustrates device 100 following deposition of interlayer dielectric material 710, such as flowable silicon dioxide, to encapsulate the source/drain regions and the dummy gate stacks.

FIG. 7 further illustrates device 100 following the removal of dummy gate 210, sacrificial SiGe 140, and formation of the high-k metal gate (HKMG) stack 720. As shown in the Figure, a replacement metal gate structure has been formed in the void space created by removal of the dummy gate 210, and sacrificial SiGe 140. Gate structure 720 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material (not shown), such as SiN, or similar materials, completing the replacement metal gate fabrication stage for the device.

FIG. 7 further illustrates device 100 following formation of source/drain contacts 730, and upper device contacts 740. A trench metal contact process yields a metallized layer adjacent to and above the S-D region 510, and 610. In an embodiment, formation of the trench metal layer 730 includes forming a silicide layer between contact and epitaxial grown S/D regions 610, and 510 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP. As shown in the Figure, following deposition of additional ILD material 710, varactor S/D regions share a common upper device metal contact 740. The varactor gate contact lies out of the plane of the view and is therefore not shown in the view.

Figure 8:
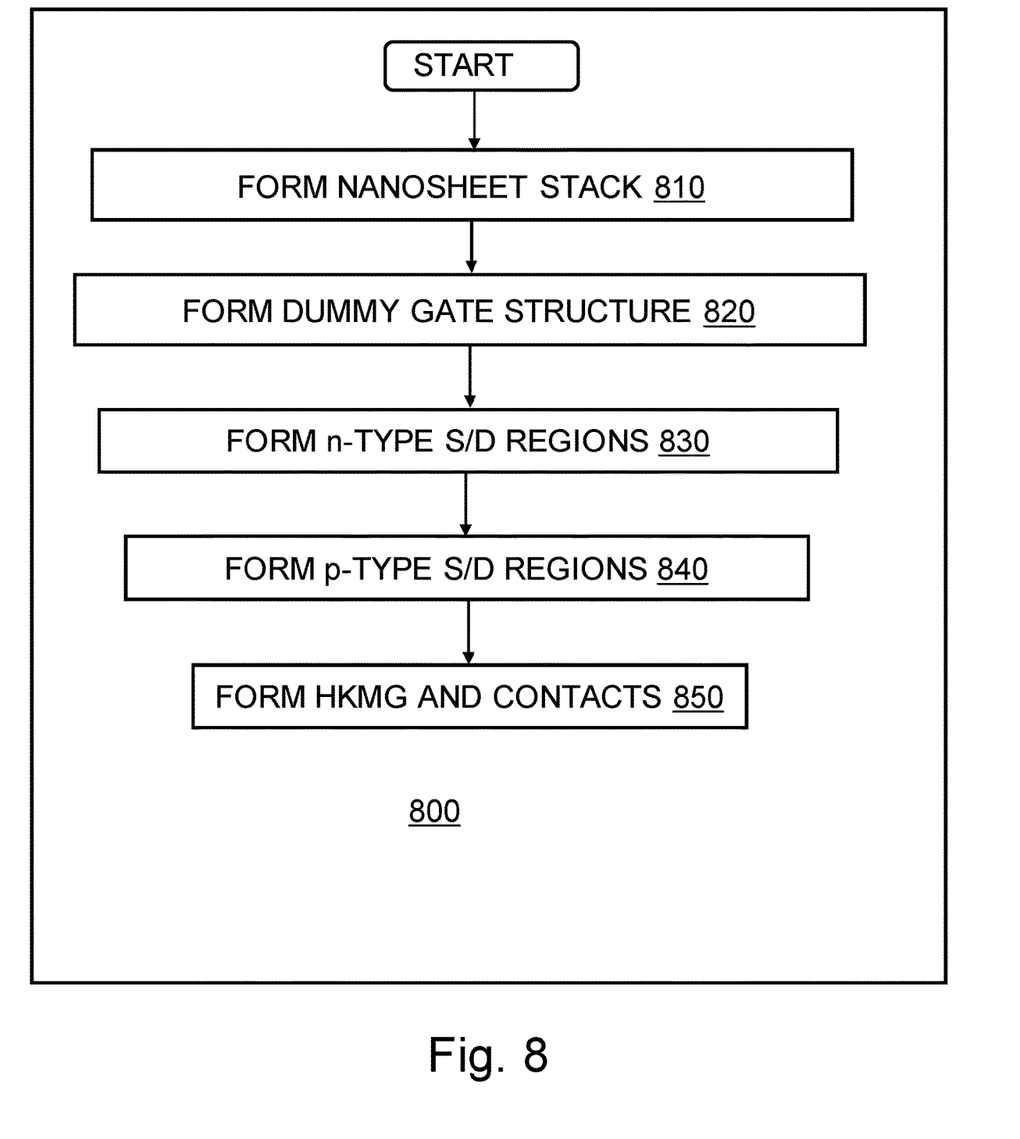
FIG. 8 provides a flowchart depicting operational steps for forming semiconductor device, according to an embodiment of the invention.

Flowchart 800, of FIG. 8, lists operational steps associated with the fabrication of a semiconductor device, according to an embodiment of the invention. At block 810, a stack of alternating semiconductor nanosheet layers are epitaxially grown upon an underlying substrate. The layers alternate between a sacrificial semiconductor material, such as a SiGe material, and semiconductor channel materials, such as Si. The stack is grown upon an additional sacrificial layer which has been previously grown upon an underlying semiconductor substrate.

At block 820, the method forms one or more dummy gate structures upon the stack of nanosheet layers. The dummy gate comprises placeholder materials sized to the desired dimensions of the eventual high-k metal gate structure.

At block 830, the method masks one side of the varactor and PFET dummy gate and nanosheet stack and epitaxially grows n-type source region adjacent to the edges of the channel nanosheets of the varactor and NFET.

At block 840, the method grows a p-type source region adjacent to the edges of the channel nanosheets on the side of the varactor dummy gate and nanosheets opposite to the n-type drain region. The n-type drain and the associated side of the varactor dummy gate are masked and the p-type source region is epitaxially grown from the edges of the channel nanosheets.

At block 850, fabrication of the device proceeds with the replacement of the dummy gate by a high-k metal gate structure. Additional fabrication steps associated with the formation of gate and a common S/D contact follows as well, completing this stage of device fabrication.

Although the invention is described with a replacement gate process flow, i.e., forming a dummy gate first, and then replacing the dummy gate with high-k/metal gate in later processing, this invention can also be applied with a gate-first process flow, i.e., a real gate (e.g., high-k/metal gate or any suitable combination of gate dielectric/gate electrode) is formed in the first place.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
    a plurality of nanosheet channels disposed between a first source/drain region and a second source/drain region;
    wherein the first source/drain region comprises a p-type material the second source/drain region comprises an n-type material; and
    a common electrical contact for the first source/drain region and the second source/drain region.

2. The semiconductor device according to claim 1 further comprising an n-type field effect transistor (FET).

3. The semiconductor device according to claim 1 further comprising inner spacers disposed between otherwise adjacent nanosheet channels.

4. The semiconductor device structure according to claim 1, further comprising a p-type field effect transistor.

5. The semiconductor device according to claim 1 further comprising a bottom dielectric isolation region.

6. The semiconductor device according to claim 1 further comprising an n-type FET and a p-type FET.

7. The semiconductor device according to claim 1 further comprising a high-k metal gate structure around the nanosheet channels.

\* \* \* \* \*